US009600013B1

(12) United States Patent
Liou

(10) Patent No.: US 9,600,013 B1
(45) Date of Patent: Mar. 21, 2017

(54) BANDGAP REFERENCE CIRCUIT

(71) Applicant: ELITE SEMICONDUCTOR MEMORY TECHNOLOGY INC., Hsinchu (TW)

(72) Inventor: Jian-Sing Liou, Kaohsiung (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 15/182,801

(22) Filed: Jun. 15, 2016

(51) Int. Cl.
*G05F 3/26* (2006.01)
*H03F 3/45* (2006.01)

(52) U.S. Cl.
CPC ......... *G05F 3/262* (2013.01); *H03F 3/45475* (2013.01)

(58) Field of Classification Search
CPC ............................ G05F 3/262; H03F 3/45475
See application file for complete search history.

(56) References Cited

U.S. PATENT DOCUMENTS

| | | | | |
|---|---|---|---|---|
| 5,373,226 A * | 12/1994 | Kimura | G05F 3/245 | 323/313 |
| 6,188,211 B1 * | 2/2001 | Rincon-Mora | G05F 1/575 | 323/273 |
| 6,906,581 B2 * | 6/2005 | Kang | G05F 3/30 | 323/313 |
| 7,570,107 B2 * | 8/2009 | Kim | G05F 3/30 | 323/313 |
| 8,283,974 B2 * | 10/2012 | Chu | G05F 3/30 | 327/539 |
| 9,141,124 B1 * | 9/2015 | Nien | G05F 3/22 | |
| 2008/0224682 A1 * | 9/2008 | Haiplik | G05F 3/30 | 323/313 |
| 2016/0252923 A1 * | 9/2016 | Nien | G05F 3/262 | |

* cited by examiner

*Primary Examiner* — Jue Zhang
(74) *Attorney, Agent, or Firm* — Juan Carlos A. Marquez; Marquez IP Law Office, PLLC

(57) ABSTRACT

A bandgap reference circuit incorporates first, second, and third current sources, first and second operational amplifiers, first and second bipolar transistors, a feedback device, a voltage divider, and a first resistor. The voltage divider divides a voltage difference between the third current source and the base of the second bipolar transistor to provide a reference voltage whose value is smaller than a silicon bandgap voltage.

9 Claims, 5 Drawing Sheets

BANDGAP REFERENCE CIRCUIT

BACKGROUND OF THE INVENTION

1. Field of the Invention

The present invention relates generally to reference circuits, and more specifically to a bandgap reference circuit.

2. Description of the Related Art

A bandgap reference circuit is used to generate a precise and a stable output voltage. The generated voltage is independent of process, voltage, and temperature. The bandgap reference circuit is widely used in various analog and digital circuits that require a precise voltage for operation.

FIG. 1 illustrates one commonly used bandgap reference circuit 100. Referring to FIG. 1, the bandgap reference circuit 100 includes PMOS transistors M1, M2, and M3, an operational amplifier OP, resistors R1 and R2, and bipolar transistors Q1, Q2, and Q3. If the base current is neglected, the output voltage VOUT of the bandgap reference circuit 100 can be expressed as:

$$VOUT = VEB3 + VT \times \ln N \times \left(\frac{R2}{R1}\right) \tag{1}$$

Where VEB3 is the emitter-base voltage of the bipolar transistor Q3, VT is the thermal voltage at room temperature, and N is the ratio of the emitter areas of the bipolar transistor Q2 to the emitter areas of the bipolar transistor Q1.

As can be seen from the equation (1), by adjusting the resistance ratio of resistor R2 to R1, the conventional bandgap reference circuit 100 can provide a stable reference voltage VOUT having a zero temperature coefficient. The voltage level of the voltage VOUT is at around 1.25V, which is approximately equal to the silicon energy gap measured in electron volts, i.e., the silicon bandgap voltage.

However, in order to meet the application requirement of different integrated circuits, a reference voltage with a substantially zero temperature coefficient at the lower voltage level is needed.

SUMMARY OF THE INVENTION

An aspect of the present invention is to provide a bandgap reference circuit to provide a reference voltage having a substantially zero temperature coefficient.

According to one embodiment of the present invention, the bandgap reference circuit comprises first, second, and third current sources, first and second operational amplifiers, first and second bipolar transistors, a feedback device, a voltage divider, and a first resistor. The first amplifier has a first input, a second input and a first output. The second amplifier has a third input, a fourth input and a second output. The first current source is coupled between a power supply node and the inverting input of the first amplifier. The second current source is coupled between the power supply node and the non-inverting input of the first amplifier. The third current source is coupled between the power supply node and the third input of the second amplifier. The first bipolar transistor has a base, an emitter coupled to the first current source, and a collector coupled to the ground voltage. The second bipolar transistor has a base coupled to the base of the first bipolar transistor, an emitter, and a collector coupled to a ground voltage. The first resistor is coupled between the second current source and the emitter of the second bipolar transistor. The feedback device is coupled between the third current source and the base of the second bipolar transistor. The feedback device is controlled by the second output of the second amplifier. The voltage divider divides a voltage difference between the third current source and the base of the second bipolar transistor to provide a reference voltage. The fourth input of the second amplifier is couple to one of the first input of the first amplifier and the second input of the first amplifier.

BRIEF DESCRIPTION OF THE DRAWINGS

The invention will be described according to the appended drawings in which.

DETAILED DESCRIPTION OF THE INVENTION

Figure 1:
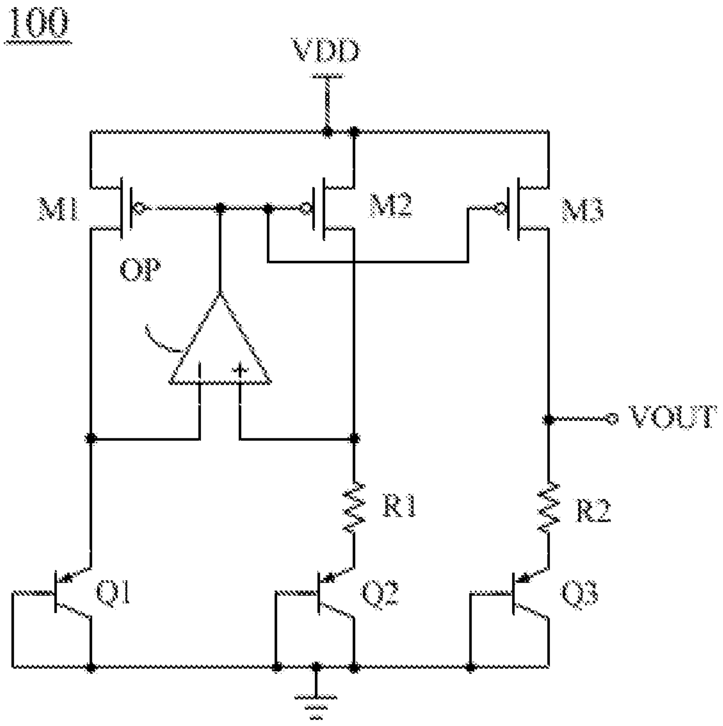
FIG. 1 (Prior Art)
FIG. 1 illustrates one commonly used bandgap reference circuit.
Figure 2:
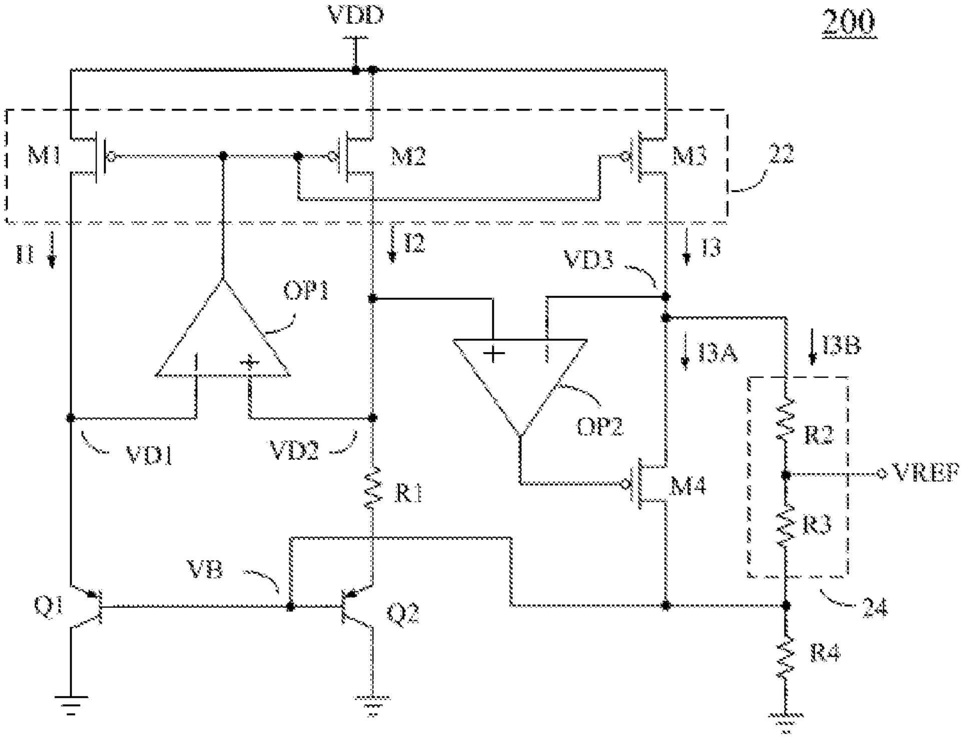
FIG. 2 shows a schematic diagram of a bandgap reference circuit for a first embodiment of the present invention.

FIG. 2 shows a schematic diagram of a bandgap reference circuit 200 according to one embodiment of the present invention. Referring to FIG. 2, the bandgap reference circuit 200 comprises a current source unit 22, an operational amplifier OP1, an operational amplifier OP2, a resistor R1, a bipolar transistor Q1, a bipolar transistor Q2, a feedback transistor M4, a voltage divider 24, and a resistor R4.

The current source unit 22 provides a plurality of stable bias currents I1, I2, and I3. In this embodiment, the current source unit 22 is a current mirror formed by a plurality of PMOS transistors M1, M2, and M3. Referring to FIG. 2, the PMOS transistor M1 has a source coupled to a supply voltage VDD, a gate coupled to an output of the operational amplifier OP1, and a drain coupled to an inverting input of the operational amplifier OP1. The PMOS transistor M2 has a source coupled to the supply voltage VDD, a gate coupled to the output of the operational amplifier OP1, and a drain coupled to a non-inverting input of the operational amplifier OP1 and a non-inverting input of the operational amplifier OP2. The PMOS transistor M3 has a source coupled to the supply voltage VDD, a gate coupled to the output of the operational amplifier OP1, and a drain coupled to an inverting input of the operational amplifier OP2.

The bipolar transistor Q1 has a base configured to receive a bias voltage VB, an emitter coupled to the inverting input of the operational amplifier OP1, and a collector coupled to a ground voltage. The bipolar transistor Q2 has a base configured to receive the bias voltage VB, an emitter, and a collector coupled to the ground voltage. The resistor R1 is coupled between the non-inverting input of the operational amplifier OP1 and the emitter of the bipolar transistor Q2.

Referring to FIG. 2, the feedback transistor M4 is a PMOS transistor having a source coupled to the inverting input of the operational amplifier OP2, a gate coupled to an output of the operational amplifier OP2, and a drain coupled to the base of the bipolar transistor Q1 and the base of the bipolar transistor Q2. The voltage divider 24 is connected in parallel with the feedback transistor M4. The resistor R4 is coupled between the voltage divider 24 and the ground voltage.

Referring to FIG. 2, the operational amplifier OP1 and the current source unit 22 constitute a negative feedback loop which forces the voltages VD1 and VD2 to be substantially equal. Thus, the voltages VD1 and VD2 can be expressed as:

$$VD1=VD2=VB+\text{VEB1}=VB+\text{VEB2}+I2\times R1 \quad (2)$$

VEB1 is the emitter-base voltage of the bipolar transistor Q1, and VEB2 is the emitter-base voltage of the bipolar transistor Q2.

Accordingly, equation (2) can rearranged into the following equation (3):

$$I2=\frac{(VEB1-VEB2)}{R1}=\frac{\Delta VBE}{R1} \quad (3)$$

Referring to FIG. 2, the operational amplifier OP2, the current source unit 22, and the feedback transistor M4 constitute a negative feedback loop which forces the voltages VD2 and VD3 to be substantially equal. Since the gates of the PMOS transistors M1, M2, and M3 are connected to each other, the sources of the PMOS transistors M1, M2, and M3 are connected to the common supply voltage VDD, and the voltages at the drains of the PMOS transistors M1, M2, and M3 are substantially equal, the currents I1, I2, and I3 flowing through the PMOS transistors M1, M2, and M3 are proportional to the W/L ratio of the transistors.

In this embodiment, the W/L ratio of the PMOS transistors M1, M2, and M3 in the current source unit 22 is set to 1:1:m, wherein m is a positive integer. Therefore, the currents I1 and I2 are substantially the same and the current I3 has m times the magnitude of the current I2.

For the purpose of conciseness, the voltage divider 24 composed of two series-connected resistors R2 and R3 is exemplified. However, the present invention is not limited to such a configuration. In this embodiment, the voltage divider 24 divides the voltage difference between the voltage VD3 and the voltage VB to provide a reference voltage VREF at the cross point of the resistors R2 and R3. Therefore, equation (3) can be rearranged into the following equation (4):

$$\begin{aligned} VREF &= (VD3-VB)\times\left(\frac{R3}{R2+R3}\right)+VB \quad (4)\\ &= (VD1-VB)\times\left(\frac{R3}{R2+R3}\right)+I3\times R4\\ &= VEB1\times\left(\frac{R3}{R2+R3}\right)+m\times\frac{R4}{R1}\times\Delta VBE \end{aligned}$$

Since the emitter-base voltage of the transistor Q1 has a negative temperature coefficient and the voltage difference ΔVBE has a positive temperature coefficient, the temperature coefficient of the voltage VREF can be adjusted to be positive, negative, or substantially zero. For example, the positive temperature coefficient of the voltage VREF is obtained by increasing the value of m or increasing the resistance ratio of the resistor R4 to R1. The negative temperature coefficient of the voltage VREF is obtained by increasing the resistance of the resistor R3 of the voltage divider 24.

Figure 3:
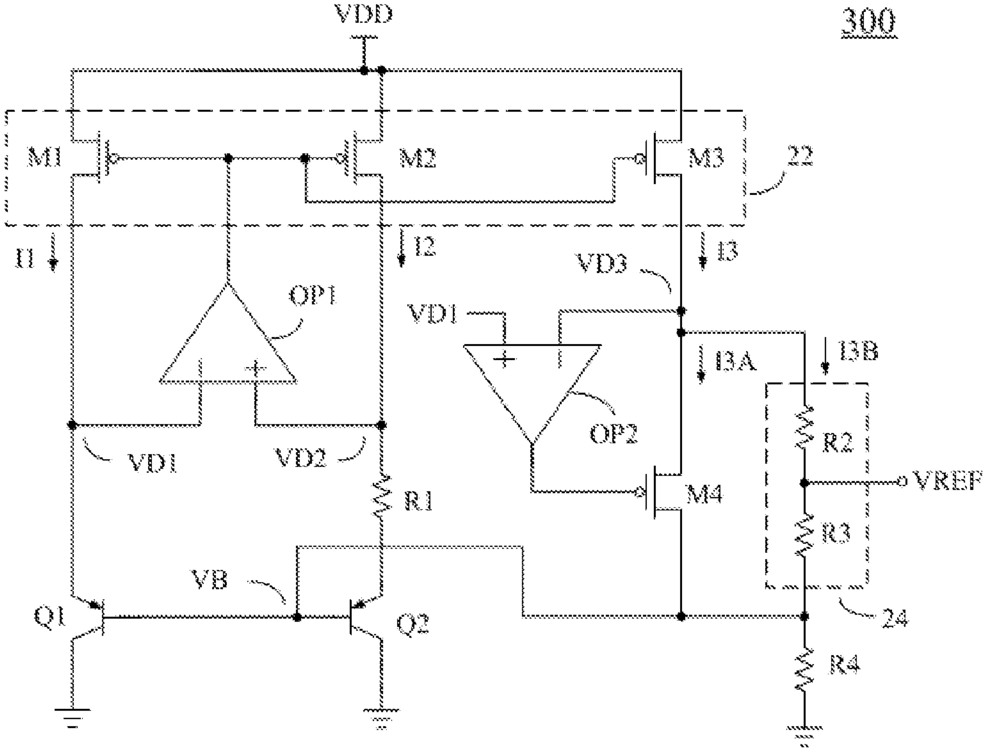
FIG. 3 shows a schematic diagram of a bandgap reference circuit for a second embodiment of the present invention.
Figure 4:
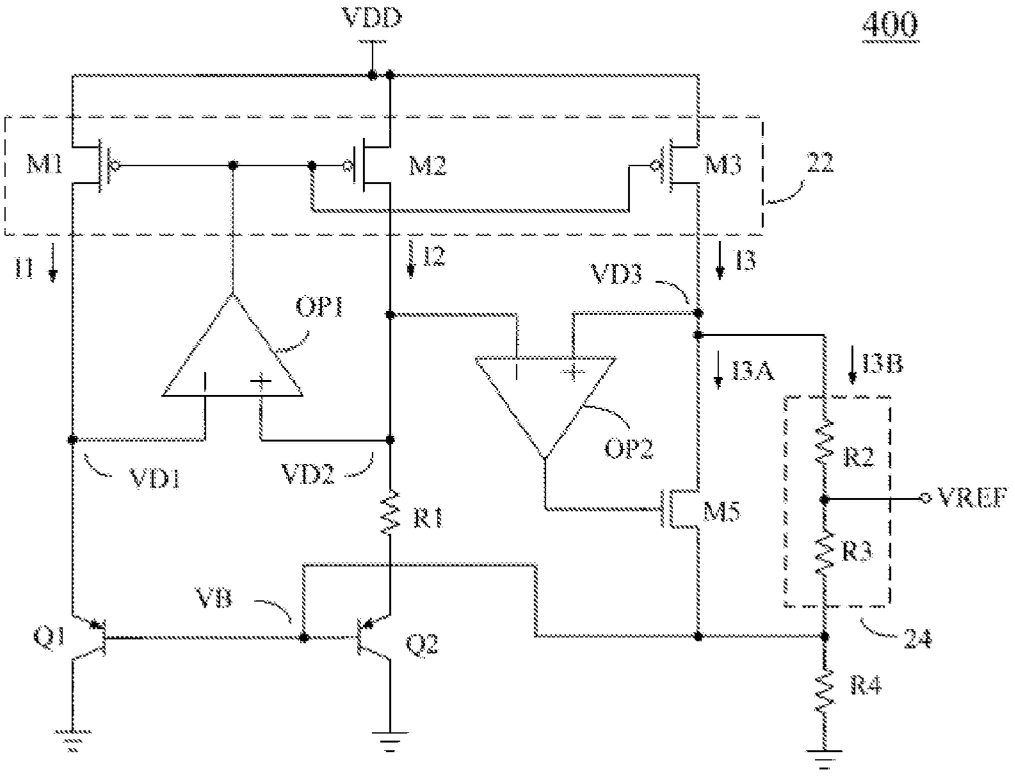
FIG. 4 shows a schematic diagram of a bandgap reference circuit for a third embodiment of the present invention.

Referring to FIG. 2, the operational amplifier OP1 and the operational amplifier OP2 maintain the voltages VD1, VD2 and VD3 at substantially equal voltages by negative feedback. However, it should be obvious that the present invention is not limited to this configuration. Referring to FIG. 3, the non-inverting input of the operational amplifier OP2 receives the voltage VD1 rather than the voltage VD2 in FIG. 2. Referring to FIG. 4, a feedback transistor M5 is a NMOS transistor having a drain coupled to the non-inverting input of the operational amplifier OP2, a gate coupled to an output of the operational amplifier OP2, and a source coupled to the base of the bipolar transistor Q1. The inverting input of the operational amplifier OP2 can be coupled to the PMOS transistor M2 as shown in FIG. 4, or coupled to the PMOS transistor M1 in another embodiment.

In addition, the prior art bandgap reference circuit provides a stable reference voltage VOUT having a substantially zero temperature coefficient at around 1.25V. However, the bandgap reference circuit 200 of FIG. 2 can provide the reference voltage having a substantially zero temperature coefficient at a lower voltage level. For example, if the resistance of the resistor R2 is equal to that of the resistor R3, the bandgap reference circuit 200 can provide the reference voltage VREF having a substantially zero temperature coefficient at a 0.63V by properly selecting the value of m or the resistance ratio of the resistor R4 to R1 according to equation (4).

Figure 5:
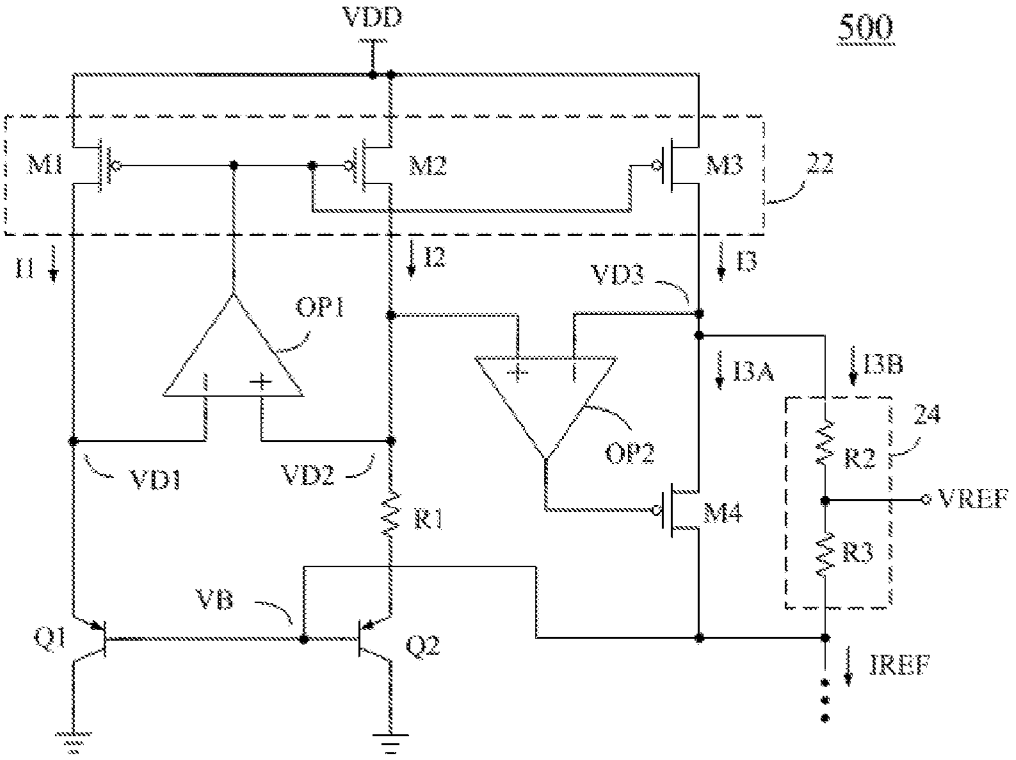
FIG. 5 shows a schematic diagram of a bandgap reference circuit for a fourth embodiment of the present invention.

The bandgap reference circuit 200 of FIG. 2 provides a stable reference voltage VREF for the internal circuits. However, the present invention is not limited to this configuration. Referring to FIG. 5, the bandgap reference circuit 500 provides a stable reference current IREF for the internal circuits. From Equation (3), the temperature coefficient of the current IREF can be adjusted by varying the W/L ratio of the PMOS transistor M3 to M2 and selecting the temperature coefficient of the resistor R1.

The above-described embodiments of the present invention are intended to be illustrative only. Numerous alternative embodiments may be devised by those skilled in the art without departing from the spirit and scope of the invention as recited in the following claims.

What is claimed is:

1. A bandgap reference circuit, comprising:

a first amplifier having a first input, a second input and a first output;

a second amplifier having a third input, a fourth input and a second output;

a first current source coupled between a power supply node and the first input of the first amplifier;

a second current source coupled between the power supply node and the second input of the first amplifier;

a third current source coupled between the power supply node and the third input of the second amplifier;

a first bipolar transistor having a base, an emitter coupled to the first current source, and a collector coupled to a ground voltage;

a second bipolar transistor having a base coupled to the base of the first bipolar transistor, an emitter, and a collector coupled to the ground voltage;

a first resistor coupled between the second current source and the emitter of the second bipolar transistor;

a feedback device coupled between the third current source and the base of the second bipolar transistor, the feedback device being controlled by the second output of the second amplifier; and a voltage divider configured to divide a voltage difference between the third current source and the base of the second bipolar transistor to provide a reference voltage;

wherein the fourth input of the second amplifier is couple to one of the first input of the first amplifier and the second input of the first amplifier.

2. The bandgap reference circuit of claim 1, further comprising a second resistor couple between the base of the second bipolar transistor and the ground voltage.

3. The bandgap reference circuit of claim 2, wherein the voltage divider comprises:

a plurality of resistors serially coupled between third current source and the base of the second bipolar transistor for providing the reference voltage.

4. The bandgap reference circuit of claim 2, wherein the feedback device comprises a PMOS transistor having a drain coupled to the base of the first bipolar transistor, a source coupled to the third input of the second amplifier, and a gate coupled to the second output of the second amplifier.

5. The bandgap reference circuit of claim 2, wherein the feedback device comprises a NMOS transistor having a source coupled to the base of the first bipolar transistor, a drain coupled to the third input of the second amplifier, and a gate coupled to the second output of the second amplifier.

6. The bandgap reference circuit of claim 2, wherein the positive temperature coefficient of the reference voltage is obtained by increasing a ratio of the emitter areas of the second bipolar transistor to the emitter areas of the first bipolar transistor.

7. The bandgap reference circuit of claim 2, wherein the positive temperature coefficient of the reference voltage is obtained by adjusting the resistance ratio of the second resistor to the first resistor.

8. The bandgap reference circuit of claim 3, wherein the negative temperature coefficient of the reference voltage is obtained by adjusting the resistance ratio of the voltage divider.

9. The bandgap reference circuit of claim 2, wherein the reference voltage is smaller than a silicon bandgap voltage.

* * * * *